United States Patent
Kozlowski (10) Patent No.: US 7,768,569 B2
(45) Date of Patent: Aug. 3, 2010

(54) HIGH SENSITIVITY COLOR FILTER ARRAY

(75) Inventor: Lester J. Kozlowski, Simi Valley, CA (US)

(73) Assignee: AltaSens, Inc., Westlake Village, CA (US)

( * ) Notice: Subject to any disclaimer, the term of this patent is extended or adjusted under 35 U.S.C. 154(b) by 892 days.

(21) Appl. No.: 11/505,728

(22) Filed: Aug. 17, 2006

(65) Prior Publication Data
US 2008/0043125 A1     Feb. 21, 2008

(51) Int. Cl.
*H04N 5/225*     (2006.01)
(52) U.S. Cl. ...................................... 348/340
(58) Field of Classification Search .................. 348/272, 348/275, 340
See application file for complete search history.

(56) References Cited
U.S. PATENT DOCUMENTS

| | | | |
|---|---|---|---|
| 2,683,769 A | 7/1954 | Banning | |
| 2,755,334 A | 7/1956 | Banning | |
| 3,971,065 A | 7/1976 | Bayer | |
| 4,558,365 A * | 12/1985 | Ochi | 348/275 |
| 4,602,289 A | 7/1986 | Sekine | |
| 5,099,317 A | 3/1992 | Takemura | |
| 5,880,460 A | 3/1999 | Merrill | |
| 6,236,434 B1 | 5/2001 | Yamada | |
| 6,456,326 B2 | 9/2002 | Fossum et al. | |
| 6,493,030 B1 | 12/2002 | Kozlowski et al. | |
| 6,522,356 B1 | 2/2003 | Watanabe | |
| 6,535,247 B1 | 3/2003 | Kozlowski et al. | |
| 6,867,549 B2 * | 3/2005 | Cok et al. | 315/169.3 |
| 7,046,284 B2 | 5/2006 | Kozlowski et al. | |
| 2004/0100570 A1* | 5/2004 | Shizukuishi | 348/272 |

* cited by examiner

*Primary Examiner*—Tuan Ho
(74) *Attorney, Agent, or Firm*—Reed Smith LLP (57) ABSTRACT

A color filter array (CFA) and image processing system wherein a color filter overlaying an image sensor has a luminance element (i.e. green filter in RGB space, or yellow in CMY space) that is made larger than the other two chrominance elements (i.e. red, blue or cyan, magenta). Additionally, overlaying micro-lenses may be sized to correspond to the relative sizes of the underlying color filters. The optimized filter array is compatible with existing de-mosaic image processing.

18 Claims, 8 Drawing Sheets

HIGH SENSITIVITY COLOR FILTER ARRAY

BACKGROUND OF THE INVENTION

1. Field of the Invention

The present invention relates generally to electronic imaging sensors, and more particularly, to color filter arrays (CFAs) formed on the sensor to generate color images.

2. Description of the Related Art

Color cameras typically use charge-coupled-devices (CCD) or CMOS Image Sensors (CIS) to capture still images and generate live or recorded video. Although it is highly desirable to provide full color depth at each picture element (i.e., pixel) to minimize optical complexity and avoid problems with image registration in the spatial or temporal domains, cost and performance considerations often force each pixel to instead process a specific principal color. Full color images are subsequently formed by appropriately processing the color information from the entire color matrix. Various performance tradeoffs are encountered with such color matrices because at least three distinct types of color information must be efficiently extracted in order to accurately represent a wide color gamut in video signal form. Camera and sensor designers hence constantly trade signal-to-noise ratio for spatial or color resolution and vice versa.

An early approach to produce color from a single sensing device used a single image sensor of broad wavelength sensitivity in conjunction with a spinning filter disc. The disc successively passed a series of color filters through the image beam in a repeating sequence to produce a color image by composing several fields. Devices operating in this manner produce a "field sequential" color signal. A major problem with this approach is that the resulting signal presents the extracted color image information in a time order that is radically different from, for instance, standard NTSC or high definition ATSC video signals. Further, color information is temporally displaced for each field and, especially, for each composite color frame. Finally, some of the color information (e.g., the blue image frame when a basic blue color filter is used) tends to be disproportionately detailed and hence wastes available bandwidth considering the response characteristics of the human eye.

Other schemes produce color images using striped color filters superimposed on a single image sensor. One such image sensor uses filter grids that are angularly superimposed on one another (see U.S. Pat. No. 3,378,633). Such image sensors produce a composite signal wherein chrominance information is represented in the form of modulated carrier signals as a result of image scanning. Such apparatus may be adapted to produce signals in the NTSC format or, if desired, the color image information can be separated by frequency domain techniques.

Striped filters which transmit a repeating sequence of three or more spectral bands have also been used in color imaging. The filters are typically aligned in one direction and the image is then scanned orthogonally to that direction. In effect, elemental sample areas are defined along the filter stripes so that sampling for a given color is not uniform for both directions. Additionally, the resulting sampling patterns once again tend to provide a disproportionate quantity of information regarding basic color vectors to which the dye has less resolving power, e.g., less important "blue" or "red" information relative to more important "green" information.

Another approach to color imaging is the "dot" scanning system, as taught by Banning in U.S. Pat. No. 2,683,769. This approach generally uses spectrally selective sensor elements arranged in triads of red, green and blue elements. In U.S. Pat. No. 2,755,334, also to Banning, a repeated arrangement of four element groupings (red-, green-, blue-, and white-sensitive elements, respectively) is alternatively described. Such approaches to color imaging have not been of practical significance until now, however, in part because of the higher cost of fabricating the large number of individual elements required to produce adequate image detail. Nevertheless, this approach is now being used to produce ultra-large displays via triads of light emitting diodes. A key advantage is that the color space is equally sampled. The resulting 4:4:4 color space precludes generation of objectionable image artifacts.

Another approach is disclosed in U.S. Pat. No. 3,971,065, invented by B. E. Bayer. In the Bayer CFA, color images are produced by a single imaging array composed of individual luminance and chrominance sensing elements that are distributed in repeating interlaid patterns wherein the luminance pattern occurs at the highest frequency of occurrence—and therefore the highest frequency of image sampling—irrespective of direction across the array.

Preferably, to produce an element array according to the Bayer approach, a solid state sensor array of broad wavelength sensitivity is provided with a superposed filter array. Filters which are selectively transparent in the green region of the visible spectrum constitute luminance-type elements, and filters selectively transparent in the red and blue spectral regions, respectively, constitute chrominance-type elements. (The term "luminance" is herein used in a broad sense to refer to the color vector which is the major contributor of luminance information. The term "chrominance" refers to those color vectors other than the luminance color vectors which provide a basis for defining an image.)

Various types of Bayer CFAs have since been developed. An effective method for re-optimizing spatial resolution involves migrating from standard rectangular patterns on an orthogonal grid to alternative configurations wherein groups of pixels are shifted horizontally and/or vertically within the overall matrix. For example, Ochi in U.S. Pat. No. 4,558,365 improves resolution and suppresses the generation of moire interference patterns by fitting octagonal photosensitive elements into a closely-packed array that also increases the photo-sensing area disposed at each pixel. Conversely, this reduces the maximum number of pixels for the available array area. Therefore, there is additional cost of fabricating a specific number of individual elements to provide sufficient image information and produce adequate detail.

Sekine in U.S. Pat. No. 4,602,289 likewise revises the spatial sampling by similarly implementing a half-pixel shift in both horizontal and vertical directions. While such a sensor would otherwise normally be disposed on a standard rectangular grid, Sekine shifts a second group of pixels by 45° relative to a first group comprising the odd-numbered columns in the matrix sensor. The gaps between obliquely adjacent photodetector sites are filled with vertical registers for signal readout.

Yamada in U.S. Pat. No. 6,236,434 similarly shifts photosensor rows and columns relative to each other to increase overall spatial sampling. Likewise, serpentine charge transfer devices are squeezed in between the obliquely adjacent photosensors to achieve signal readout. Since each photosensor is physically reduced in size, however, photosensor "fill factor" and dynamic range are once again smaller than could otherwise be achieved.

The spatial sampling enabled by U.S. Pat. Nos. 4,558,365, 4,602,289 and 6,236,434 can be effective for objects predominantly disposed in a diagonal orientation, such as tree branches, mountain ridges, pyramids, etc. On the contrary, buildings, telephone poles and other man-made or natural objects are alternately singly and multiply sampled along a column or a row of the sensor. Takemura in U.S. Pat. No. 5,099,317 thus generally improves the efficacy of diagonalized spatial sampling by using multiple sensors in conjunction with a beam-splitting prism. Rather than performing the diagonal shift within a sensor, Takemura diagonally shifts two (or more) sensors relative to each other to produce multiple samples at each position in the spatial domain. Effective resolution is thus enhanced since the multiple sensors interject additional spatial samples at the corners of each normally-located pixel. This construction also increases sensitivity by using multiple sensors to produce each full color sample. Locating the second array of sensors 45 degrees with respect to the horizontal and 45 degrees with respect to the vertical also increases vertical and horizontal resolution in addition to the diagonal resolution at cost of reducing total pixel count.

Most recently, Sony Corp. has developed ClearVid™ CMOS using the diagonalization previously described in video cameras using one or multiple sensors. The modification with respect to the prior art is reducing the density of red and blue pixels to about $\frac{1}{6}^{th}$ of the green pixels to further boost luminance S/N ratio. However, the non-standard CFA configuration requires custom signal processing electronics, to recompose the raw color information into a suitable format; the coarse blue and red pixel distribution supplied by the so-called "de-mosaicing" electronics degrades chrominance resolution to a level below generally accepted standards.

Since the Bayer CFA is now sufficiently ubiquitous so that de-mosaicing of various pixel shapes from rectangular through hexagonal and diamond (U.S. Pat. No. 6,522,356) is supported by standard signal processing electronics, it is greatly advantageous to revise a Bayer-like CFA to address specific shortcomings, rather than to pursue custom alternatives. The CFA pattern should also support extant standards for luminance and chrominance resolution.

SUMMARY OF THE INVENTION

In general, the present invention is an optimized color filter array (CFA) pattern and imaging system that improves S/N ratio while maintaining compatibility with standard image processing electronics previously developed to handle standard Bayer CFAs. Since the ratio of chrominance to luminance elements is not compromised, color integrity is maintained relative to existing still capture and video standards.

More particularly, the present invention is a color filter array and imaging system in which the luminance element of the filter pattern (i.e. green filter in RGB space, or yellow in CMY space) is made larger than the other two chrominance elements (i.e. red, blue or cyan, magenta). Additionally, overlaying micro-lenses may be sized to correspond to the relative sizes of the underlying color filters.

In one embodiment, the pattern and frequency of the color filters may correspond to a standard Bayer pattern, such that the imaging system is compatible with standard de-mosaic processing. Also, the ratio of the luminance element to chrominance elements is preferably 4:2:2, as in the standard Bayer pattern.

An imaging system formed according to the present invention includes the unique color filter arrangement of the present invention, and a standard image sensor, which provides an imaging system having an improved S/N ratio.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art. Any and all such modifications, equivalents and alternatives are intended to fall within the spirit and scope of the present invention.

Visible imaging systems implemented in CMOS have the potential for significant reductions in cost and power requirements in components such as image sensors, drive electronics, and output signal conditioning electronics. A video camera, for example, can be configured as a single CMOS integrated circuit supported by only an oscillator and a battery. Such a CMOS imaging system requires lower voltages and dissipates less power than a CCD-based system. These improvements translate into smaller camera size, longer battery life, and applicability to many new products.

Because of the advantages offered by CMOS visible imagers, there has been considerable effort to develop active-pixel sensor (APS) devices. Active-pixel sensors can provide low temporal noise comparable or superior to scientific grade CCD systems. Active-pixel circuits, on the other hand, can increase fixed pattern noise (possibly requiring additional circuitry to suppress the noise) and limit scalability. For example, U.S. Pat. No. 6,456,326 teaches a technique to suppress pixel-based fixed pattern noise via conventional correlated double sampling via complex pixel design, but does not achieve fixed-pattern noise below 0.2% (Col. 5, Line 23). Alternative image sensors that are competitive to CCDs must have fixed pattern noise at least an order of magnitude lower.

Specifically, no technique is taught to suppress the column-based noise produced by either column signal conditioning or the subsequent A/D conversion. U.S. Pat. No. 5,880,460 also discloses a mechanism for suppressing pixel-based noise, specifically the noise generated by sampling power supply noise on a row-by-row basis, but no solution is supplied to suppress the noise of the subsequent signal conditioning.

Figure 1:
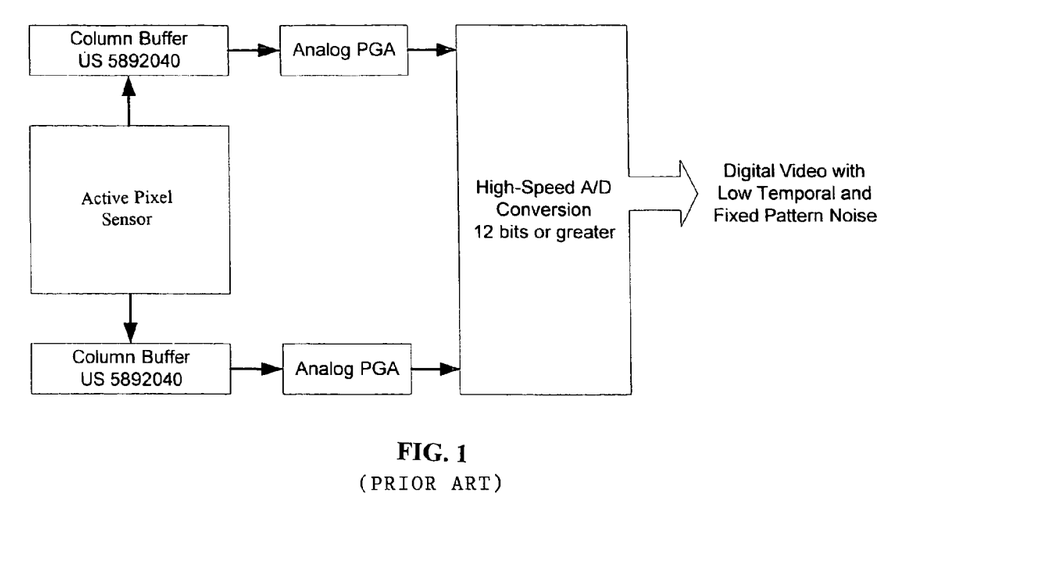
FIG. 1 is a block diagram of a representative imaging system of the prior art.

FIG. 1 shows an imaging system consisting of compact active pixels whose noise is minimized by applying tapered reset (such as taught by U.S. Pat. Nos. 6,493,030 and 6,535, 247), a supporting column buffer, optional analog programmable gain amplifier with tunable electronic bandwidth, and closely located high-speed A/D conversion having ≧12 bit resolution. The A/D conversion is preferably a single pipeline unit.

Figure 2:
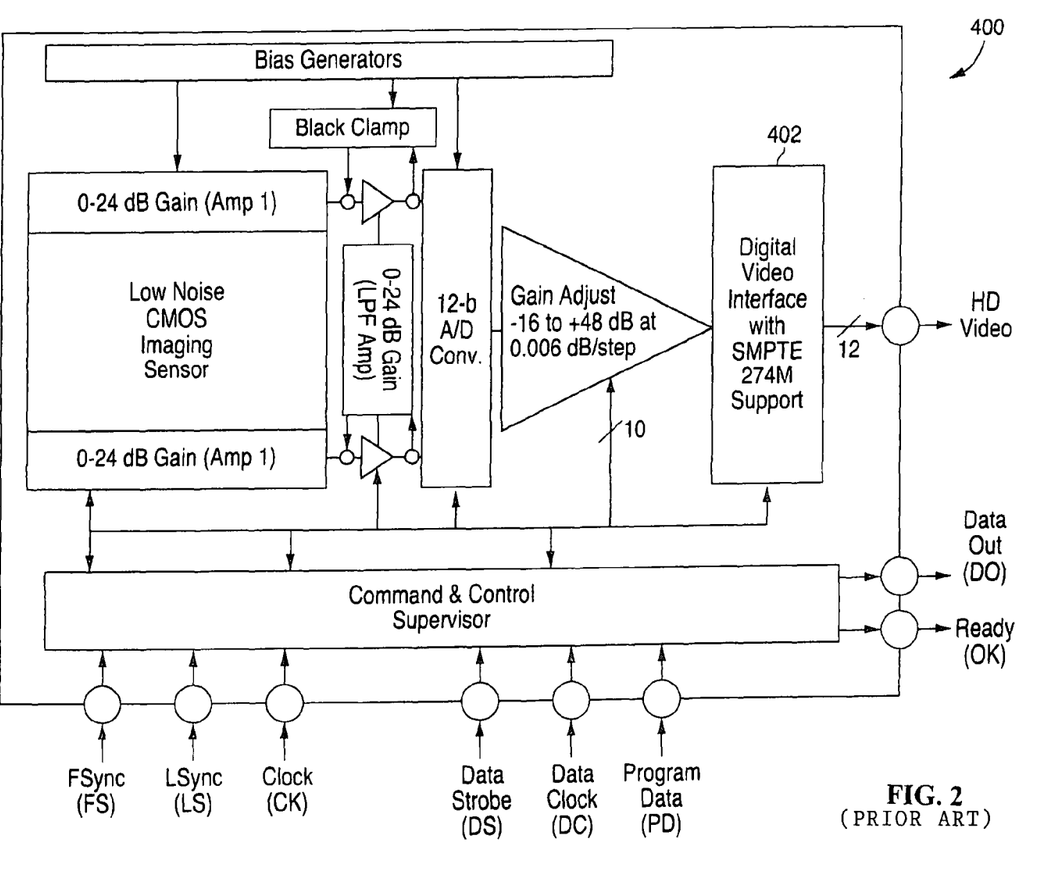
FIG. 2 is a block diagram of a representative HDTV imaging system of the prior art.
Figure 3A:
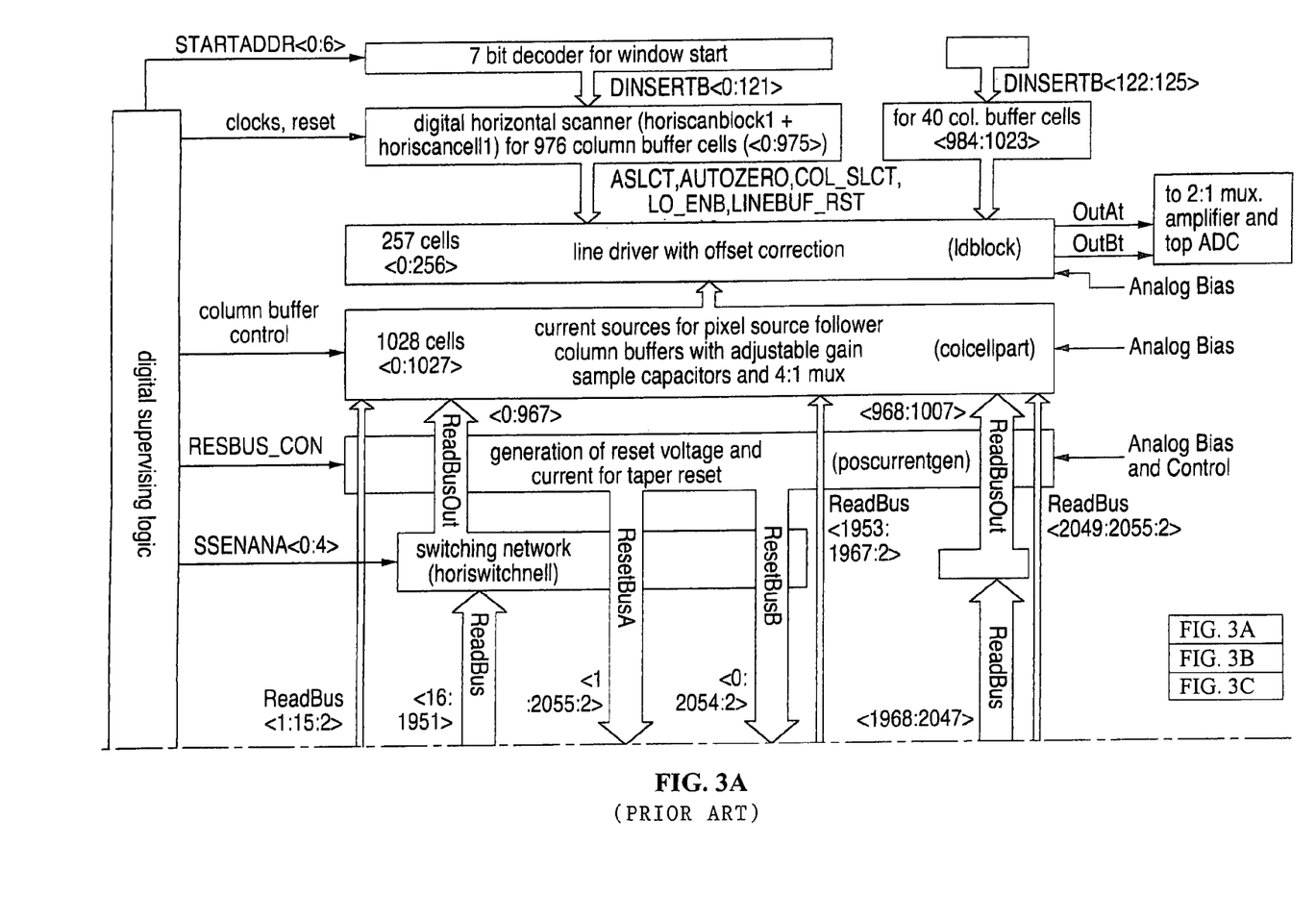
FIGS. 3A, 3B and 3C are a detailed block diagram for a representative imaging system of the prior art.
Figure 3B:
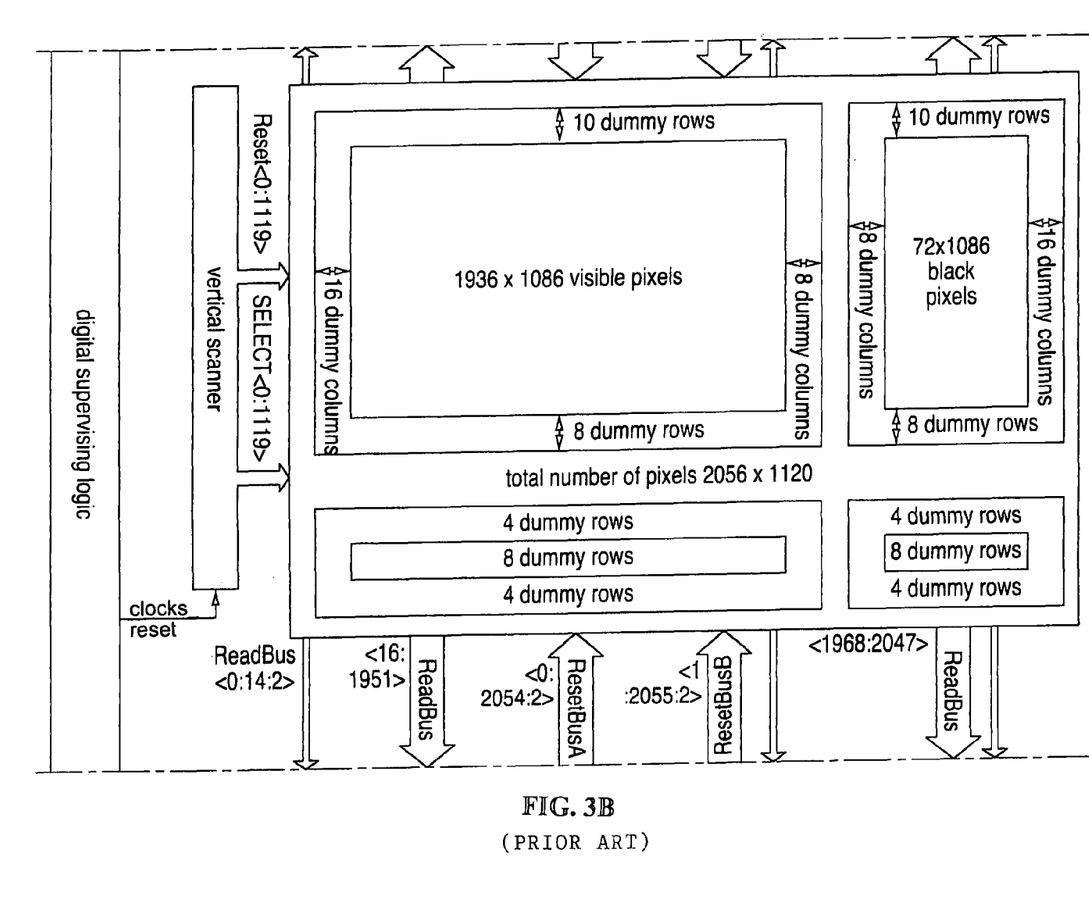
Figure 3C:
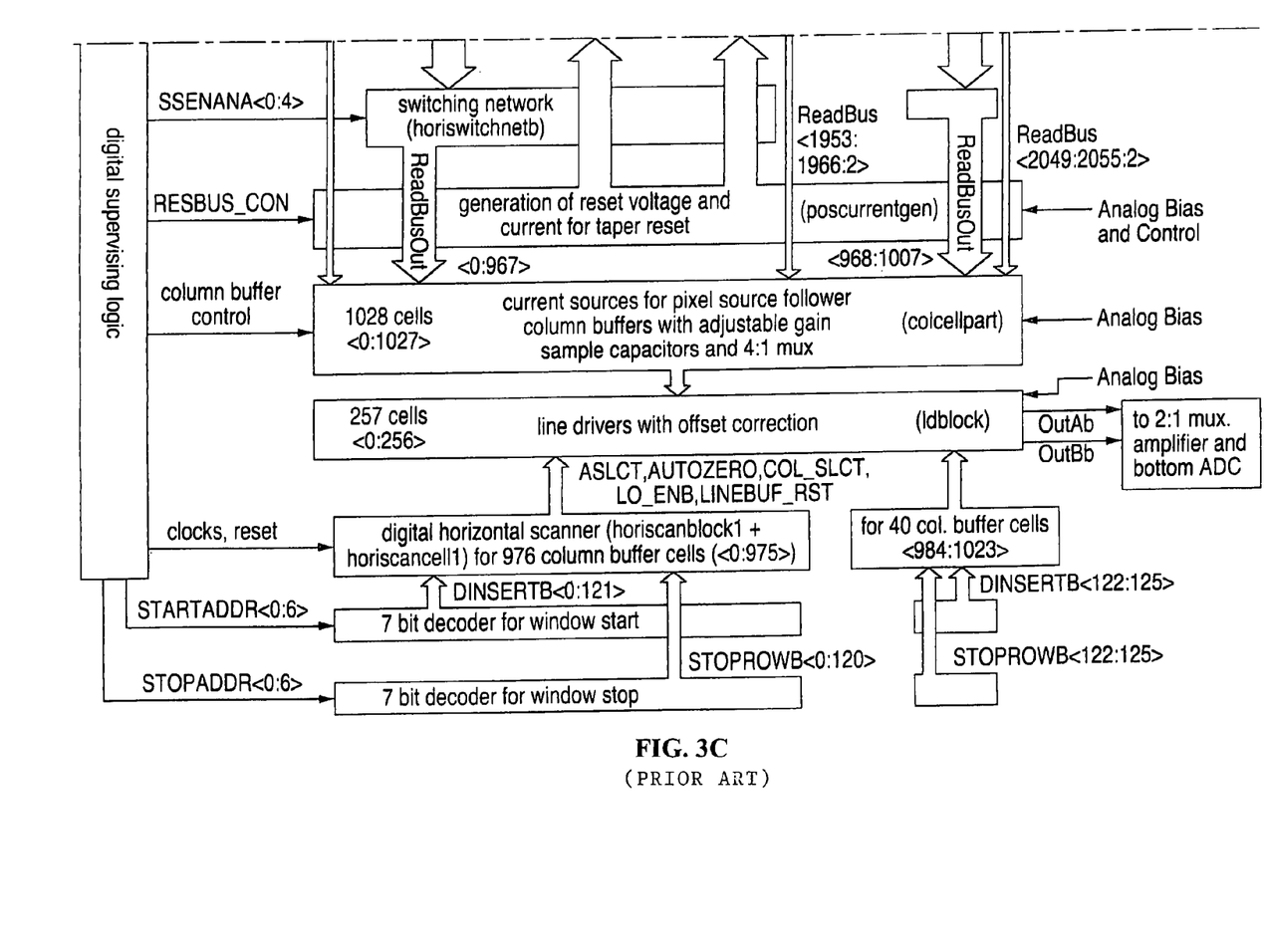

FIG. 2 shows the basic block diagram for a representative embodiment including peripheral circuits to provide video for high definition television. FIG. 3 shows a representative detailed block diagram.

The CMOS readout and amplification system of the present invention includes an exemplary design for an optimum color filter array to be applied to imaging sensors such as the representative active-pixel CMOS imagers. A prototype embodiment of the low-noise APS invention can be configured, for example, as a visible imager comprising an array of 2500 (columns) by 2000 (rows) of visible light detectors (photodetectors). The rows and columns of active-pixels can be spaced 2 microns center-to-center using 0.18 μm design rules to provide as-drawn optical fill factor of ~40%. Several columns and rows of detectors at the perimeter of the light-sensitive region are normally covered with metal and used to establish the dark level for on-chip or off-chip signal processing.

Figure 4:
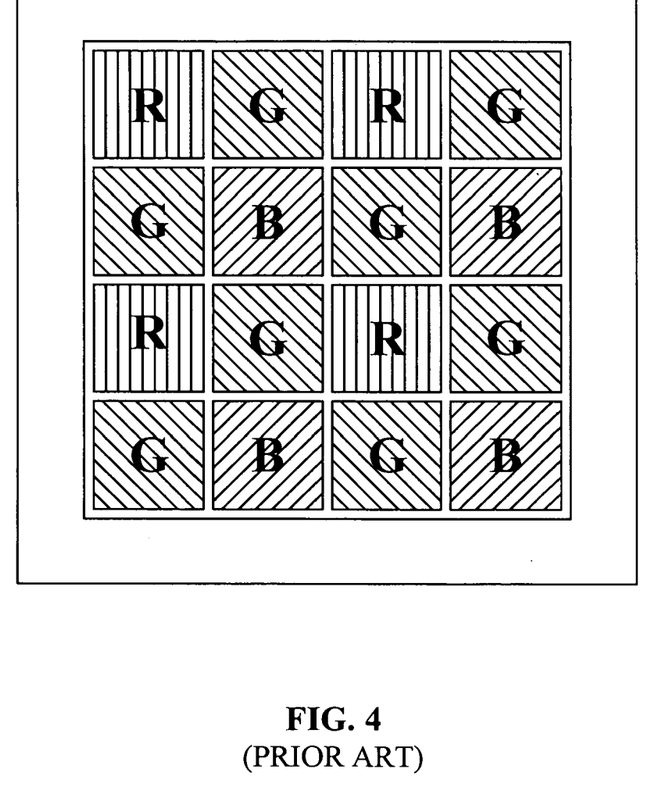
FIG. 4 is a standard RGB pattern with black border pattern for an exemplary imaging sensor of the prior art comprising a 4 by 4 matrix of pixels.

In addition, the detectors in each row can be covered with color filters to produce color imagers. For example, the odd rows may begin at the left with red, green, and then blue filters, and the even rows may begin with blue, red, and then green filters, with these patterns repeating to fill the respective rows. This constitutes the standard Bayer filter pattern as shown in FIG. 4.

Figure 5:
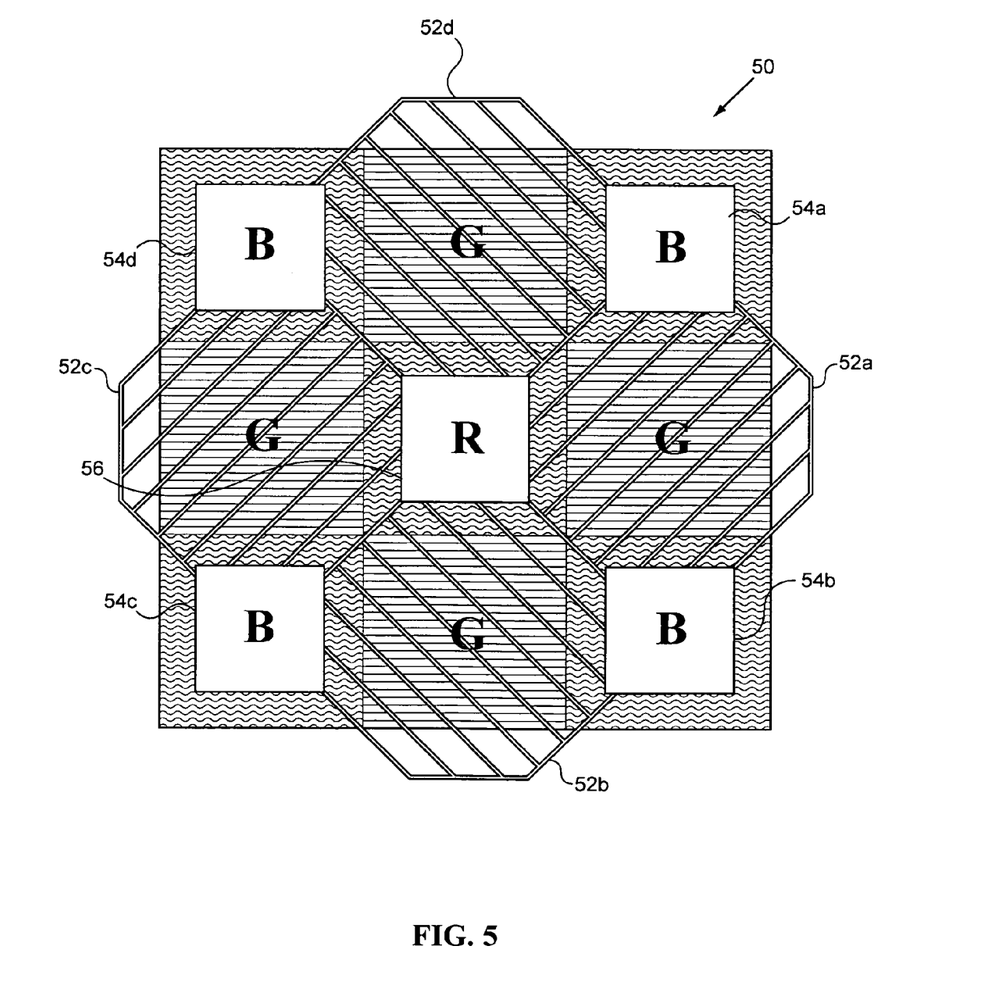
FIG. 5 is an optimized Bayer CFA pattern of current invention showing a region of 3 by 3 pixels within a larger matrix array of arbitrary dimensions.

Instead of using the standard rectangular geometry for each color filter in the Bayer pattern, the present invention utilizes an optimized Bayer filter pattern shown in FIG. 5. The representative embodiment increases the area of the green pixels relative to the blue and red pixels by about 50% over a standard pattern. However, the sampling resolution is unchanged. At the same time, the area of each green pixel is increased by about 50%. Consequently, luminance SNR using simple demosaic processing directly increases by 3.5 dB.

The present invention will be described herein using an example of "Red, Green, Blue" color filters, or so-called "RGB" color space. As is known in the art, a color filter pattern using Cyan, Magenta, Yellow (CMY) may also be employed. The present invention may also use CMY color filters, where the yellow filter is the "luminance" element and corresponds to the green filter in the RGB color space.

As shown in FIG. 5, the green filters' 52*a*, 52*b*, 52*c*, 52*d* size are increased relative to the blue 54*a*, 54*b*, 54*c*, 54*d* and red 56 filters. Note that the relative sizes of the blue 54*a*, 54*b*, 54*c*, 54*d* and red 56 filters are reduced to make room for the increased size of the green filters 52*a*, 52*b*, 52*c*, 52*d*. Also, to maximize area, the green filters are preferably formed as octagons. Thus, the present invention maximizes the space for the green filters, without changing the dimensions or arrangement of the underlying image sensor.

Figure 6:
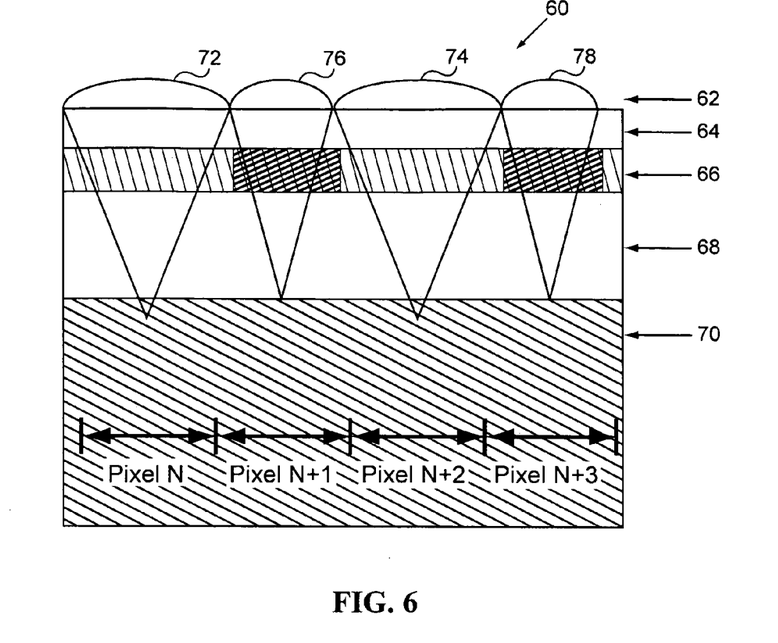
FIG. 6 is a cross-sectional view of an embodiment of the present invention.

FIG. 6 illustrates the embodiment of FIG. 5 in cross-section. Micro-lenses 62 at the top of the imaging system 60 direct light into each pixel. Note that the micro-lenses 72, 74 for the green pixels are larger than the lenses for the red 76 and blue 78 pixels. Similarly, in the color filter array (CFA) layer, the green filters are larger than the red or blue filters. Below the micro-lenses 62, is a planarization layer 64. Next is the color filter array 66, and the CMOS metal layers and inter-level dielectrics 68. Finally, the CMOS substrate layer 70 includes the matrix of photodiodes and CMOS transistors forming the image sensor. The light-receptive photodiodes for each pixel, however, are of the same dimension, as in a standard CIS array. The effect of this construction is to increase the amount of luminance information captured by the CIS array, without requiring any special de-mosaicing processing. The scheme is fully compatible for use with standard image processing electronics.

In one embodiment of the present invention, the color filter array is designed to boost the luminance SNR by approximately 3 dB relative to that achieved using a standard RGB matrix with equally sized pixel areas. In the standard matrix, all three colors use equal collection areas having identical pitch, p, so the maximum collection area is conventionally $p^2$ and each square pixel vertically comprises a micro-lens, color filter and electronic circuit. The pixel pitch, p, is established by the as-drawn pitch of the underlying CMOS circuit as shown in FIG. 7.

Figure 7:
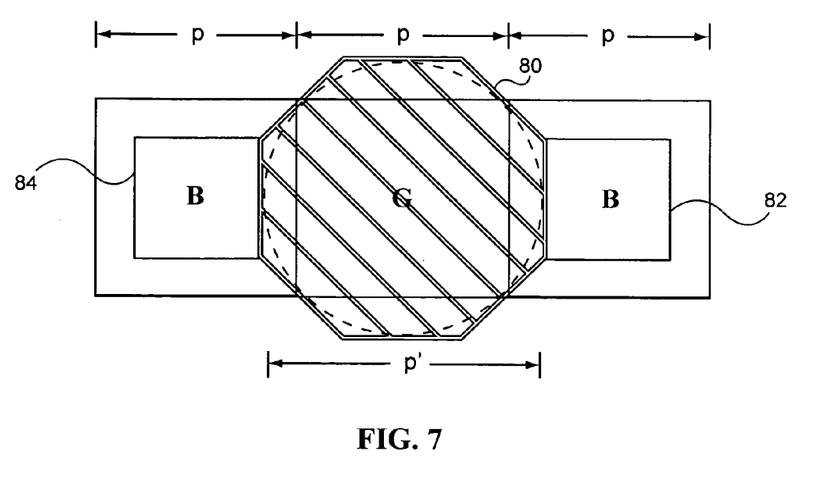
FIG. 7 illustrates the size of green filter according to a preferred embodiment of the present invention.

According to this embodiment of the present invention, each green pixel 80, which is drawn with octagonal geometry, should have effective area $\sqrt{2}\, p^2$, i.e., an octagonal region having area that is about 40% larger than that defined by conventional design. Approximating the area of the octagonal area used to form the green filtered pixels of this invention by the enclosed circle that is bound within the octagonal, the area of each green pixel is approximately:

$$G_{area} = \pi \left(\frac{p'}{2}\right)^2$$

Where p' is the width of the octagonal, as shown in FIG. 7. To facilitate larger collection area, the area of the enclosed circle is therefore:

$$G_{area} = \pi \left(\frac{p'}{2}\right)^2 = \sqrt{2}\, p^2$$

The resulting pitch (or diameter) of the enscribed circle yielding the desired area is:

$$p' = \sqrt{\frac{4\sqrt{2}}{\pi}}\, p \approx 1.34 p$$

So, for standard pixel pitch of 2 microns, the green octagonals should have 2.68 micron pitch with red and blue pixels 82, 84 having 1.32 micron pitch (square).

To achieve approximately 1 dB boost in luminance S/N ratio, the green pixels should nominally collect over 12.2% larger area than for the conventional matrix. The target pitch for green pixels is in this case:

$$p' = \sqrt{\frac{4 \times 1.22}{\pi}}\, p \approx 1.25 p$$

The alternative configuration with 1 dB enhancement is SNR consequently has green octagonal pixels having 2.5 micron pitch. The red and blue pixels will thus have 1.5 micron pitch. As in the prior example, the three color filters and supporting micro-lenses accurately fit over the underlying electronics supporting each pixel. The pitch of the underlying electronics is uniform at 2 microns in both directions.

The new Bayer pattern according to the present invention can be re-optimized further. If the aggregate areas of the blue and red pixels are further reduced to the area of appropriate for Sony's ClearVid™ CMOS sensors, then the luminance SNR can be boosted over 5 dB, depending on microlens efficiency. The fundamental limit for SNR improvement depends on the pixel pitch, micro-lens performance, and intrinsic color crosstalk for the specific process (manufacturing) technology.

Since the green pixel of the present invention is drawn as an octagon and is usually manufactured using a clear material that is reflowed by thermal manufacturing to produce the desired shape, the final shape is relatively circular. Consequently, the pseudo-circular lenses supporting these larger pixels will have the highest performance. This is convenient since it is important to fit the resulting spot into the available photodiode area of the underlying pixel electronics.

Thus, the present technique provides for higher S/N ratio at standard 4:2:2 color sampling than can be provided with other recently developed schemes. For video imaging applications, this allows camera designers to provide for relatively noise-free images as a camera pans from dark to light scenes, or light to dark scenes, while supporting higher resolution and using less power and less space on chip than competing approaches.

Furthermore, the electronic video is generated using the standard color matrix supporting 4:2:2 color space so chrominance information is not excessively sub-sampled. Alternative configurations for boosting the S/N ration of the luminance information from the sensor often reduce the number of luminance samples. Such sub-sampling generates moiré patterns and associated artifacts that corrupt the integrity of the final images.

As disclosed herein, the present invention discloses a Bayer-compatible CFA that has one or more of the following advantages: 1) maximizes the pixel count within the available area; 2) maximizes signal-to-noise ratio of the luminance channel; 3) provides appropriate chrominance coverage to achieve full color resolution; 4) maintains standard 4:2:2 color space to support uncompromised video matching full high definition video (HDV) standard; 5) delivers excellent dynamic range; 6) maintains backward compatibility with standard Bayer CFA processing by simply reoptimizing the sensor's CFA pattern; and 7) maximizes resolution by maximizing pixel count within the available area.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A color filter array comprising:
   at least one first color filter;
   at least one second color filter; and
   at least one third color filter, wherein the third color filter is a luminance element and has a larger area than the at least one first or second color filter;
   wherein each filter is covered by a separate micro-lens, such that a micro-lens covering the at least one third color filter has a larger area than the micro-lenses covering the at least one first color filter or second color filter.

2. The color filter array of claim 1, wherein the at least one third color filter is approximately twice as larger as the at least one first or second color filter.

3. The color filter array of claim 1, wherein the color filter array comprises a plurality of third color filters, first color filters and second color filters, and wherein the ratio of third color filters to first and second color filters is 4:2:2, respectively.

4. The color filter array of claim 3, wherein the total area of the third color filters is greater than the total area of first and second color filters.

5. The color filter array of claim 3, wherein the first color filter is red, the second color filter is blue and the third color filter is green.

6. The color filter array of claim 3, wherein the first color filter is cyan, the second color filter is magenta, and the third color filter is yellow.

7. A color filter array overlaying an electronic image sensor, the color filter array comprising:
   a plurality of first color filters;
   a plurality of second color filters;
   a plurality of third color filters, wherein the plurality of third, second and first color filters are arranged in a matrix in a ratio of 4:2:2, respectively, and wherein each third color filter has an area that is larger than an area of a first color or a second color filter;
   an array of micro-lenses positioned in alignment with the matrix of filters, wherein each color filter is aligned with a separate micro-lens, and wherein the micro-lenses aligned with the third color filters have an area that is larger than an area of the micro-lenses aligned with the first or second color filters.

8. The color filter array of claim 7, wherein each third color filter has approximately two times the area of each first color filter.

9. The color filter array of claim 7, wherein each third color filter has approximately two times the area of each second color filter.

10. The color filter array of claim 7, wherein the total area of the third color filters is greater than the total area of the first and second color filters.

11. The color filter array of claim 7, wherein each third color filter is a luminance element and comprises a green filter, each first color filter comprises a red filter, and each second color filter comprises a blue filter.

12. The color filter array of claim 7, wherein each third color filter is a luminance element and comprises a yellow filter, each first color filter comprises a cyan filter, and each second color filter comprises a magenta filter.

13. The color filter array of claim 7, wherein the electronic image sensor comprises a plurality of equal sized pixels.

14. An imaging system comprising:
   an array of photodiodes arranged in a matrix of pixels, the array of photodiodes forming part of an electronic image sensor, and wherein each pixel is of equal area;
   an array of color filters, comprising a first color, a second color and a third color filter arranged in a matrix, the array of color filters arranged in alignment with the array of photodiodes, such that each photodiode is covered by a color filter;
   an array of micro-lenses arranged in alignment with the array of color filters and array of photodiodes, such that each photodiode and color filter is covered by a micro-lens;
   wherein each third color filter is a luminance element and each third color filter has an area that is larger than an area of each first or second color filter, and the area of a micro-lens covering each third color filter is similarly larger than an area of each micro-lens covering the first and second color filters.

15. The imaging system of claim 14, wherein a ratio of third color filters to first and second color filers is 4:2:2, respectively.

16. The imaging system of claim 14, wherein the imaging system is compatible with standard Bayer pattern color filter array de-mosaic processing.

17. The imaging system of claim 14, wherein each first color filter is red, each second color filter is blue, and each third color filter is green.

18. The imaging system of claim 14, wherein each first color filter is cyan, each second color filter is magenta, and each third color filter is yellow.

* * * * *